US007183634B2

(12) United States Patent
Lee

(10) Patent No.: US 7,183,634 B2
(45) Date of Patent: Feb. 27, 2007

(54) PRINTED CIRCUIT BOARD TACT SWITCH

(76) Inventor: Soo Ho Lee, 307-1004 Galhoon Apt., Queenstown, 372 Boolo-dong, Seo-gu Incheon 404-270 (KR)

( * ) Notice: Subject to any disclaimer, the term of this patent is extended or adjusted under 35 U.S.C. 154(b) by 339 days.

(21) Appl. No.: 10/514,469

(22) PCT Filed: Jun. 7, 2004

(86) PCT No.: PCT/KR2004/001357

§ 371 (c)(1), (2), (4) Date: Aug. 5, 2004

(87) PCT Pub. No.: WO2004/109732

PCT Pub. Date: Dec. 16, 2004

(65) Prior Publication Data

US 2006/0073341 A1 Apr. 6, 2006

(51) Int. Cl.
*H01L 23/02* (2006.01)

(52) U.S. Cl. ....................................... 257/678; 257/687

(58) Field of Classification Search ................ 257/678, 257/687; 428/413

See application file for complete search history.

(56) References Cited

U.S. PATENT DOCUMENTS 6,423,918 B1 * 7/2002 King et al. ................. 200/406
6,525,416 B2 * 2/2003 Hauser et al. .............. 257/687

* cited by examiner

*Primary Examiner*—Phat X. Cao
*Assistant Examiner*—Theresa T. Doan
(74) *Attorney, Agent, or Firm*—Porter Wright Morris & Arthur LLP

(57) ABSTRACT

The present invention relates to a PCB-type tactile switch, which improves clicking operation and prevents operational errors, thus improving functionality and reliability of products including the tactile switch. The tactile switch of the present invention comprises an insulating member (100), an interval maintaining member (200), a lower pattern (300), a solder mask (400), a groove (500), a upper conducting coat (600), a lower conducting coat (610), a short circuit part of electricity (700), a metal dome (800), and a cover layer (900).

5 Claims, 4 Drawing Sheets

PRINTED CIRCUIT BOARD TACT SWITCH

FIELD OF THE INVENTION

The present invention relates to a printed circuit board (PCB)-type tactile switch, and more particularly to a PCB-type tactile switch which improves clicking operation and prevents operational errors, thus improving functionality and reliability of products including the tactile switch.

BACKGROUND OF THE INVENTION

Generally, a tactile switch is to switch circuits by a slight touch. It has been widely used as a part of various modernized electronic products due to its simple operation and accuracy in switching circuits and its simple structure.

Recently, the tactile switch has been used in mobile communication devices such as cellular phones, and various up-to-date electronic personal devices such laptop computers, handy cassettes, MP3 players, etc. which tend to be more and more miniaturized. Following this tendency, a PCB type tactile switch having a smaller size, lighter weight and less thickness than the conventional tactile switch has been developed.

One conventional PCB type tactile switch is shown in FIG. 1 in its sectional view. It comprises:

an insulating member (10) made of nonconducting material in the shape of a thin plate;

a upper pattern (20) made of conducting material, provided on the insulating member (10), and including a central contact (21), an external contact (23) and a short circuit part (22) to electrically short-circuit between the central contact (21) and the external contact (23);

a lower pattern (30) made of conducting material and provided under the insulating member (10);

a metal dome (40) made of elastic and conducting metallic material and having a convex center and a circumferential end which secures on the external contact (23) of the upper pattern (20), wherein the convex center is protruded in the shape of a dome away from the central contact (21), and is pressed by an external pressure to come into contact with the central contact (21) to apply electricity;

a cover layer (50) made of nonconducting substances to fix the metal dome (40) on top of the upper pattern (20);

a through hole (60) formed by perforating the upper pattern (20), the insulating member (10) and the lower pattern (30) to provide a shelter for the air in the metal dome (40) in clicking the metal dome (40); and a solder mask (70) covering a bottom surface of the lower pattern (30) with nonconducting substances, except for bottom parts of the lower pattern (30) which require soldering.

Therefore, if a user presses a central part of the metal dome (40), as the circumferential end of the metal dome (40) has already been contacted to the external contact (23), the convex center of the metal dome (40) comes into contact with the central contact (21), which drives a circuit connected to any corner of the lower pattern (30) by soldering or applies operating signals to the circuit.

In the above conventional tactile switch, when the metal dome (40) is slightly pressed to apply the electric current to the circuit or apply operating signals, the bottom surface of the convex center of the metal dome (40) comes into contact around the central part of the upper pattern (20).

In this case, however, since the conventional tactile switch was manufactured in a small and compact size in order to be adopted for ultralight and very thin electronic parts, the convex center of the metal dome (40) was formed low. Thus, in the conventional tactile switch shown in FIG. 1, wherein the central contact (21) was as high as the external contact (23), if the metal dome (40) had been clicked, the user could feel it only minutely.

Therefore, the user could rarely detect the contact of the metal dome (40) with the central contact (21), which might cause the user to click further or once more, which in turn might cause wrong operation of the electronic parts and entire electronic products.

In addition, the through hole (60), which provides shelter for the inside air of the metal dome (40) in clicking the metal dome (40), was formed by the process of perforation by means of a drill. However, since the perforation of the through hole (60) of a very small diameter should be done on the very thin and small tactile switch, it required a lot of skill and accuracy in order to reduce the inferiority of goods.

Further, since the volume of the through hole (60) was not enough to hold the air under the metal dome (40), it was difficult to expect that all of the inside air under the metal dome (40) could be retained in the through hole (60). Thus, the sensibility over the clicking deteriorated.

Furthermore, since the through hole (60) was formed by perforating the upper pattern (20), the insulating member (10) and the lower pattern (30), lead could be introduced into the through hole (60), during the process of soldering at the corners of the tactile switch for connection to the circuit.

Therefore, in order to prevent the inflow of the solder into the through hole (60) and to provide insulation as well, the solder mask (70) was provided under the lower pattern (30) by a method of printing. However, since the through hole (60) could not be covered with ink completely by printing the solder mask (70), it was necessary to perform the printing 2 or 3 times, which resulted in the increase of manufacturing time and costs.

Also, although the through hole (60) had been blocked by ink through many times of printing, the effect of blocking was not complete, thus resulting in inferior products and deterioration of reliability of products.

SUMMARY OF THE INVENTION

Therefore, an object of the present invention is to provide a PCB type tactile switch with an excellent clicking operation, by allowing a metal dome of the tactile switch to descend enough to come into contact with a lower pattern thereof.

Another object of the present invention is to provide a PCB type tactile switch having sufficient space for airflowing under the metal dome, thus improving the performance of clicking.

A further object of the present invention is to provide a PCB type tactile switch without a through hole, thus preventing inferior goods produced during the process of blocking the through hole, and improving productivity and reliability of products including the tactile switch.

In order to achieve the above objects, a PCB type tactile switch according to the present invention comprises:

an insulating member made of nonconducting substances in the shape of a thin plate;

an interval maintaining member provided on the insulating member;

a lower pattern made of conducting material and provided under the insulating member;

a solder mask covering a bottom surface of the lower pattern with nonconducting substances, except for bottom parts of the lower pattern which require soldering;

a groove formed by perforating central parts of the interval maintaining member and the insulating member so that a top surface of the lower pattern can be exposed;

a upper conducting coat applied on top of the interval maintaining member and the groove for electric contact;

a lower conducting coat applied under the lower pattern for electric contact;

a short circuit part of electricity formed by cutting off the upper conducting coat and the interval maintaining member surrounding the groove, so that an internal part and an external part divided by the short circuit part can be electrically short-circuited;

a metal dome made of elastic and conducting metallic material and having a convex center and a circumferential end which secures around the short circuit part, wherein the convex center is pressed by an external pressure to come into contact with the lower pattern through the groove; and a cover layer adhered on a top surface of the upper conducting coat to prevent the separation of the metal dome.

Accordingly, in contrast to the conventional tactile switch, the through hole is not formed in the present invention, and thus the process of forming the hole using a drill is unnecessary.

Also, it is not necessary to make technical efforts to block the inflow of the solder and flux into the through hole during the soldering process, thus considerably decreasing the inferiority of products.

Furthermore, in clicking the metal dome, since the groove is formed as deep as the thickness of the interval maintaining member, whether the metal dome is clicked or not can be definitely detected by a user. Thus, malfunction of the electronic parts and entire electronic products including the tactile switch, which has been caused by additionally clicking, can be prevented.

Also, since the groove is deep and wide enough to cover the flow of the air, clicking of the metal dome feels soft.

BRIEF DESCRIPTION OF THE DRAWINGS

The accompanying drawings, which are included to provide a further understanding of the invention and are incorporated in and constitute a part of this specification, illustrate an embodiment of the invention and together with the description serve to explain the principles of the invention, wherein.

DESCRIPTION OF THE PREFERRED EMBODIMENTS

Figure 1:
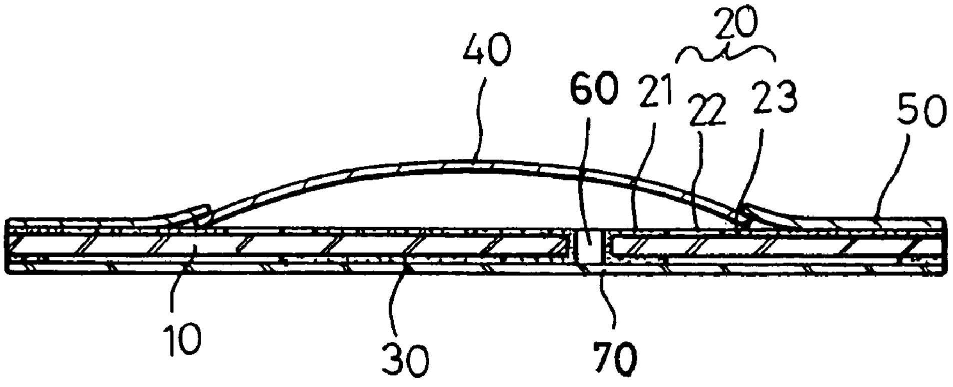
Fig. 1 PRIOR ART
FIG. 1 is a sectional view of the conventional PCB type tactile switch.
Figure 2:
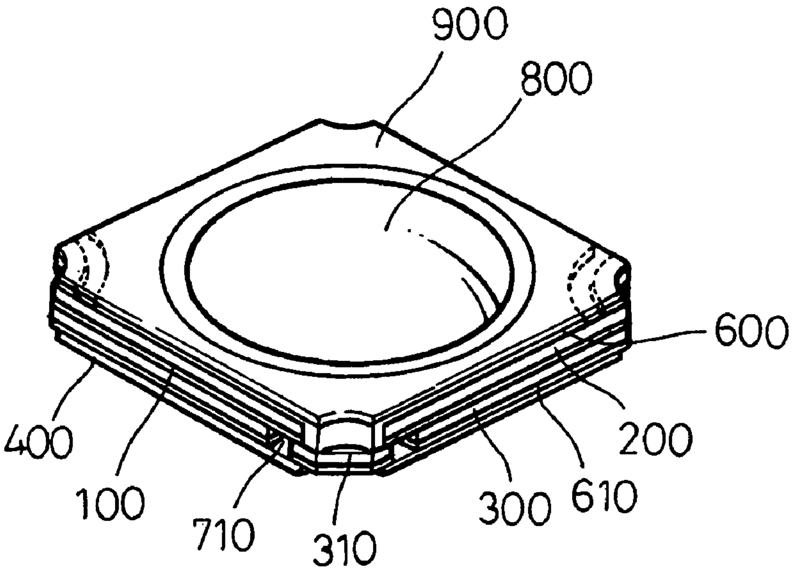
FIG. 2 is a perspective view of the tactile switch according to the present invention.
Figure 3:
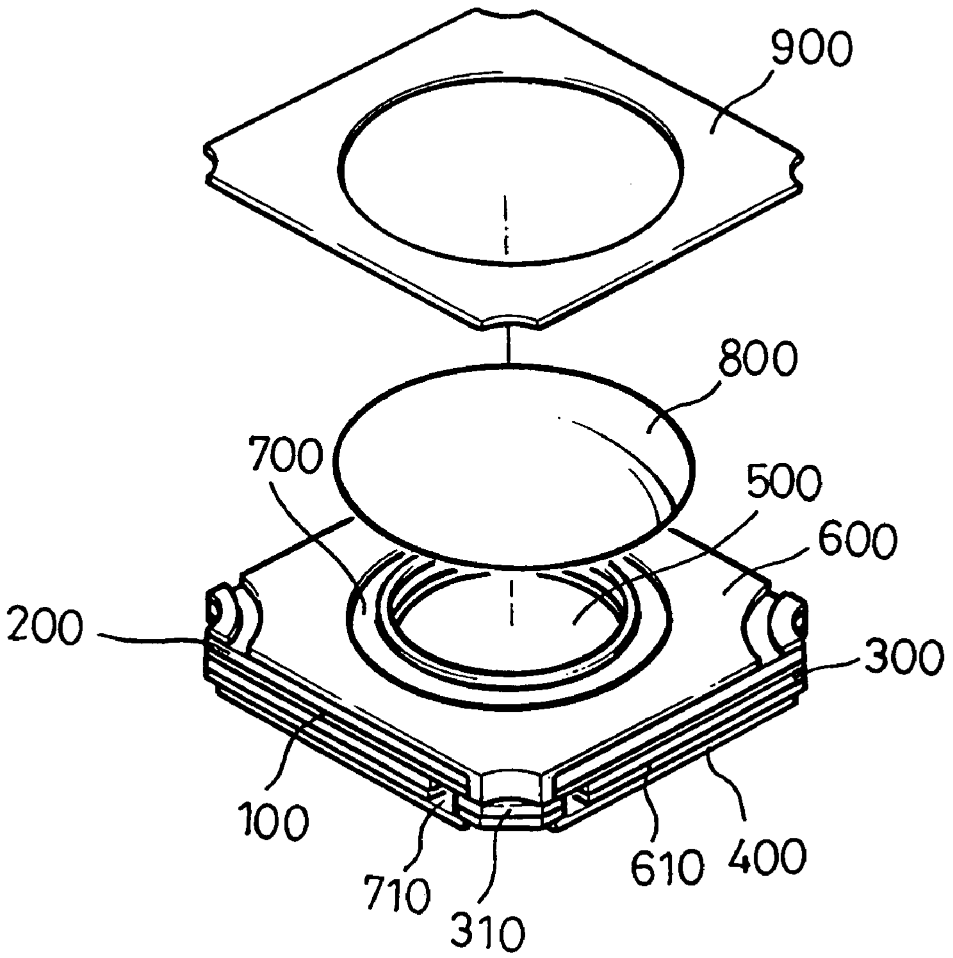
FIG. 3 is an exploded perspective view of the tactile switch according to the present invention.

Reference will now be made in detail to a preferred embodiment of the present invention in conjunction with the accompanying drawings.

As shown in FIGS. 2 to 6, a PCB type tactile switch according to the present invention comprises an insulating member (100), an interval maintaining member (200), a lower pattern (300), a solder mask (400), a groove (500), a upper conducting coat (600), a lower conducting coat (610), a short circuit part of electricity (700), a metal dome (800), and a cover layer (900).

The insulating member (100) is made of nonconducting substances in the shape of a thin plate to electrically short-circuit the interval maintaining member (200) and the lower pattern (300).

The interval maintaining member (200) is provided on the insulating member (100) and serves to function similarly to the upper pattern (20) of the conventional tactile switch. The member (200) is preferably made of conducting material, e.g., laminated copper. It can also be made of synthetic resin sheet of nonconducting material.

The lower pattern (300) provided under the insulating member (100) is made of conducting material in a thin laminated shape to be in electric contact with circuits of electronic appliances. It is preferable that the lower pattern (300) is made of laminated copper.

It is preferable that the insulating member (100) is made of synthetic resin, e.g., epoxy film. It is advantageous that the insulating member (100) is made in the form of a sheet having adhesive property on either side or both sides thereof, for instance, in the form of a tape.

Thus, the interval maintaining member (200) can be simply stuck to the insulating member (100), and then it is perforated together with the insulating member (100) by a press to form the groove (500).

After the groove (500) is formed, the lower pattern (300) is thermally adhered to the bottom surface of the insulating member (100).

To the bottom surface of the lower pattern (300), the solder mask (400) is adhered.

Figure 4:
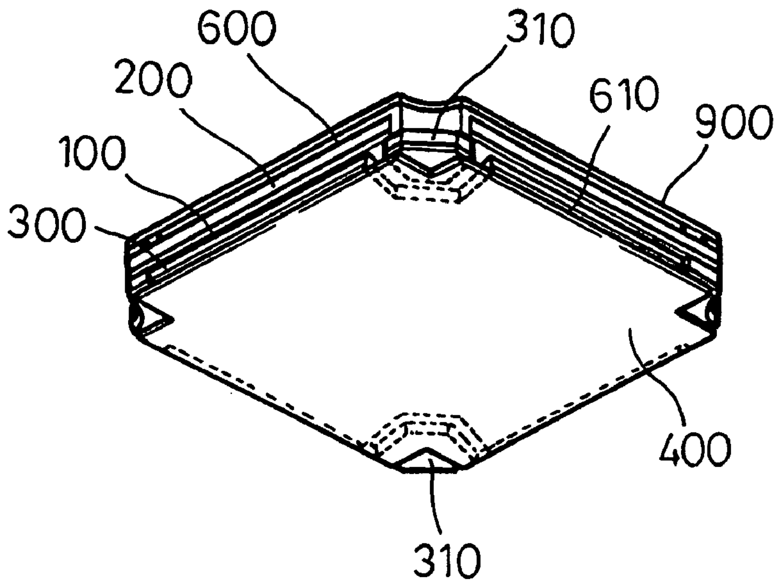
FIG. 4 is a perspective bottom view of the tactile switch according to the present invention.

The solder mask (400) covers most bottom parts of the lower pattern (300) with nonconducting substances, except for some parts which demand soldering, e.g., except for soldering parts located in the corners of the bottom surface of the lower pattern (300) as shown in FIG. 4. The solder mask (400) is usually composed of nonconducting ink.

As described above, the interval maintaining member (200) and the insulating member (100) are adhered to each other and perforated together by a press mold to form the groove (500).

Therefore, the top surface of the lower pattern (300) is exposed so that it comes into contact with the metal dome (800) in clicking.

On top of the interval maintaining member (200), the upper conducting coat (600) made of conducting material is applied thin for electric contact.

The upper conducting coat (600) is formed by plating the interval maintaining member (200) with conducting material such as copper, which facilitates uniform plating thereof.

The upper conducting coat (600) is also applied on a part of the lower pattern (300), which has been exposed.

It is not necessarily required that the upper conducting coat (600) be applied on the exposed part of the lower pattern (300), since both the lower pattern (300) and the upper conducting coat (600) are made of conducting material. However, during the process of plating, the upper conducting coat (600) is automatically applied on the exposed part of the lower pattern (300).

During this process of plating, the circumference of the groove (500) is also coated with the upper conducting coat (600).

When the copper plating is conducted by the upper conducting coat (600), since the lower pattern (300) has already been adhered under the insulating member (100), the bottom surface of the lower pattern (300) is also plated to form the lower conducting coat (610).

Figure 5:
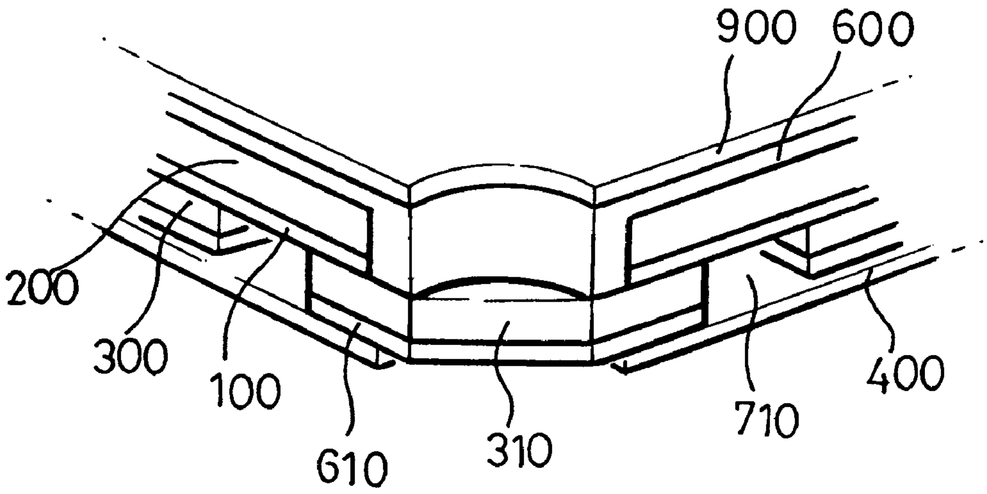
FIG. 5 is an enlarged perspective view of one corner of the tactile switch according to the present invention.
Figure 6:
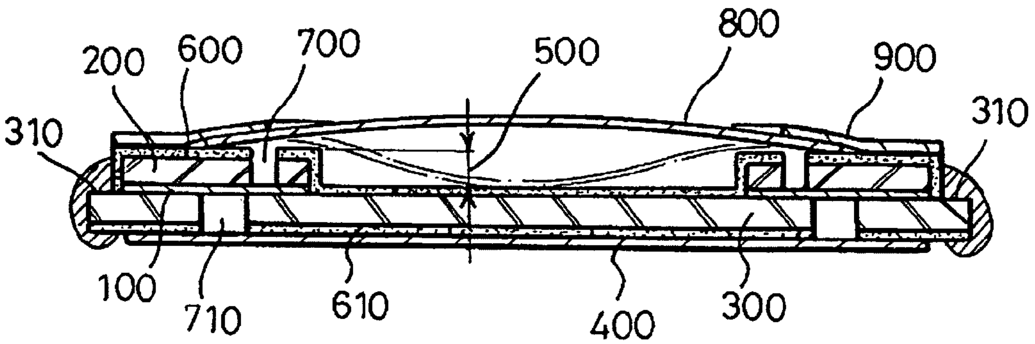
FIG. 6 is a sectional view of the tactile switch according to the present invention.

As shown in FIGS. 4 to 6, for electric short circuit, more than one short circuit part of conductivity (710) are formed in the vicinity of corners, by cutting off the lower conducting coat (610) and the lower pattern (300) by etching.

Also, the short circuit part of electricity (700) is formed by cutting off the upper conducting coat (600) and the interval maintaining member (200) together by etching around the groove (500), so that the internal and external parts divided by the short circuit part (700) can be electrically short-circuited.

Therefore, as the circumference of the metal dome (800) is seated on the upper conducting coat (600), surrounding the circumference of the short circuit part of electricity (700), and as the central convex of the metal dome (800) is positioned over the groove (500), the metal dome (800) can make an interval with the lower pattern (300) far enough to sense clicking definitely.

When the metal dome (800) is pressed, with the lower circumference thereof having seated on the upper conducting coat (600) and surrounding the circumference of the short circuit part (700), the metal dome (800) is elastically bent and its convex center is contacted to the lower pattern (300) via the groove (500), so that specific circuits of electronic appliances can be connected or operating signals can be input.

The cover layer (900) is provided around the circumference of the metal dome (800) and partly adhered on top of the upper conducting coat (600) to prevent the separation of the metal dome (800).

Since the metal dome (800) has elasticity, when the pressure is relieved, the metal dome (800), which has been bent to the lower pattern (300), returns to its original position.

The cover layer (900) is formed in the shape of a film made of synthetic resin. The bottom surface of the cover layer (900) is covered with thermosetting adhesives, and is thermally adhered to the top surface of the upper conducting coat (600), with the metal dome (800) being mounted in its position.

According to the tactile switch as constructed above, the metal dome (800) is contacted with the lower pattern (300) in clicking, since the groove (500) is formed as high as or as deep as the thickness of the interval maintaining member (200). On the contrary, in the conventional tactile switch as shown in FIG. 1, the bottom surface of the metal dome (40) is contacted with the central contact (21) of the upper pattern (20).

Accordingly, the present invention enables a user to sense the contact of the tactile switch more clearly and easily, by clicking the metal dome (800) at its maximum distance.

In the meantime, as shown in FIGS. 5 and 6, it is preferable to provide projections (310) extending from the lower pattern (300) at its corners, where soldering is done for connection with a circuit board.

The projections (310) enable soldering parts to firmly seat and fix on PCB, thus improving the stability of circuits.

According to the present invention, there is no through hole provided for holding the air under the metal dome.

Thus, it is not necessary to perform the process of forming and blocking the through hole, and there is no possibility of inferior products occurring in the process.

According to the present invention, the PCB type tactile switch having an excellent clicking operation can be obtained, by providing a sufficient operating space for the metal dome to come into contact with the lower pattern of the switch.

Also, productivity and reliability of electronic products including the tactile switch according to the present invention can be improved.

What is claimed is:

1. A PCB type tactile switch comprising:

an insulating member (100) made of nonconducting substances in the shape of a thin plate;

an interval maintaining member (200) provided on the insulating member (100);

a lower pattern (300) made of conducting material and provided under the insulating member (100);

a solder mask (400) covering a bottom surface of the lower pattern (300) with nonconducting substances, except for bottom parts of the lower pattern (300) which require soldering;

a groove (500) formed by perforating central parts of the interval maintaining member (200) and the insulating member (100) so that a top surface of the lower pattern (300) can be exposed;

an upper conducting coat (600) applied on top of the interval maintaining member (200) and the groove (500) for electric contact;

a lower conducting coat (610) applied under the lower pattern (300) for electric contact;

a short circuit part of electricity (700) formed by cutting off the upper conducting coat (600) and the interval maintaining member (200) surrounding the groove (500), so that an internal part and an external part divided by the short circuit part (700) can be electrically short-circuited;

a metal dome (800) made of elastic and conducting metallic material and having a convex center and a circumferential end which secures around the short circuit part (700), wherein the convex center is pressed by an external pressure to come into contact with the lower pattern (300) through the groove (500); and a cover layer (900) adhered on a top surface of the upper conducting coat (600) to prevent the separation of the metal dome (800).

2. The PCB type tactile switch as claimed in claim 1, wherein the interval maintaining member (200) is made of laminated copper.

3. The PCB type tactile switch as claimed in claim 1, wherein the interval maintaining member (200) is made of synthetic resin sheet.

4. The PCB type tactile switch as claimed in claim 1, wherein the lower pattern (300) is extended at its corners to form projections (310), which facilitate soldering parts to secure on PCB.

5. The PCB type tactile switch as claimed in any one of claims 1 to 4, wherein the upper conducting coat (600) and the lower conducting coat (610) are made of copper.

* * * * *